Sept. 26, 1961 R. F. RUTZ 3,002,100

TRANSISTOR CIRCUIT ELEMENT

Original Filed Sept. 27, 1954 5 Sheets-Sheet 1

INVENTOR
RICHARD F. RUTZ

BY Alvin J. Riddles
ATTORNEY

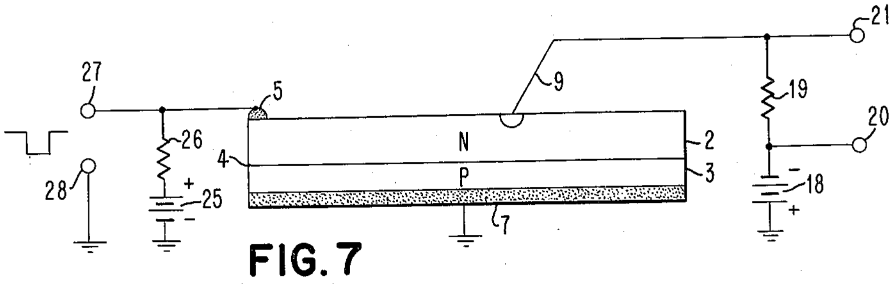
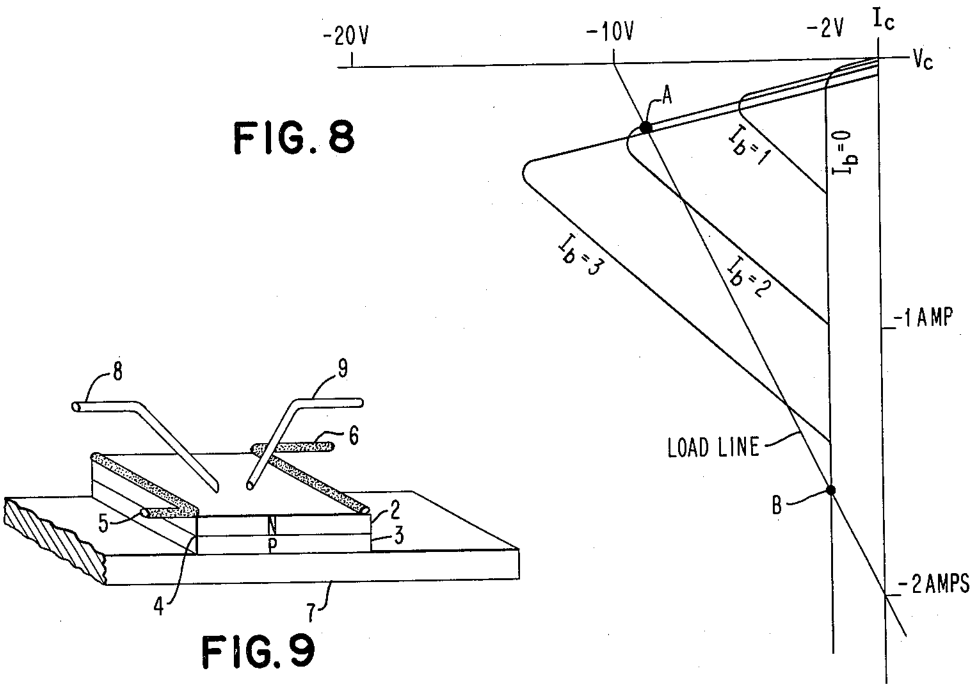
FIG. 8, FIG. 9
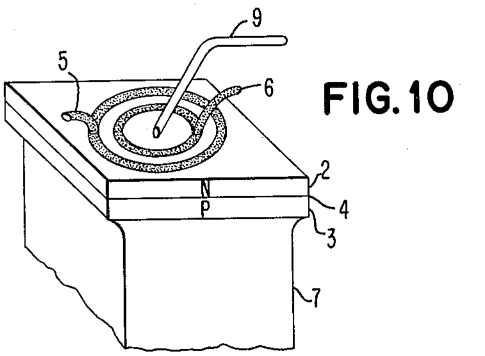

United States Patent Office 3,002,100

Patented Sept. 26, 1961

3,002,100

TRANSISTOR CIRCUIT ELEMENT

Richard F. Rutz, Fishkill, N.Y., assignor to International Business Machines Corporation, New York, N.Y., a corporation of New York Original application Sept. 27, 1954, Ser. No. 458,619, now Patent No. 2,889,499, dated June 2, 1959. Divided and this application Sept. 26, 1958, Ser. No. 763,620
4 Claims. (Cl. 250—211)

This application is a division of application, Serial No. 458,619, filed September 27, 1954, entitled "Transistor Circuit Element" now U.S. Patent No. 2,889,499.

This invention relates to transistor circuit elements and more particularly to transistor circuit elements incorporating the use of both a P-N junction and a point contact in the same structure.

In general, a transistor is made up of a body of semiconductor material having three connections thereto known as the emitter, the collector and the base. There are two basic types of transistor devices used extensively in the art at the present time, namely, the point contact device, wherein the emitter and the collector connections are rectifying point contacts and the junction device, wherein the emitter or collector connection or both includes a junction between two zones of opposite conductivity type in the semi-conductive body. Such a junction is known in the art as a P–N junction. The point-contact type of device is described in Patent 2,524,035 to J. Bardeen and W.H. Brattain granted October 3, 1950, and the junction type of device is described in Patent 2,569,347 to W. Shockley granted September 25, 1951. The advantages and limitations of the point-contact and junction types of devices when used in circuit applications are well known in the art and need not be discussed. This invention is directed to the construction of an improved transistor having advantages heretofore not available in the art, by incorporating, into one structure, a semi-conductor body containing a P–N junction and a point contact collector.

Accordingly, one feature of this invention is to provide an improved transistor circuit element having the property of controllable collector characteristics.

Another feature of this invention is to provide an improved transistor circuit element requiring no emitter bias voltage source.

Still another feature of this invention is to provide an improved transistor circuit element having bistable properties such that a very small control current can drive the device from a state of low collector current to a state of extremely high collector current in a manner analogous to thyratron action.

A related feature of this invention is to provide an improved transistor circuit element that has greater sensitivity to heat and light which, under certain conditions, is desirable.

Another related feature of this invention is to provide an improved transistor circuit element having a finite delay time between input and output.

Briefly, the manner in which these and other features of this invention are provided is that, in this novel transistor, two semi-conductor properties are used that are not frequently found in the same structure. These properties are the ability of a P–N junction to oppose or enhance the flow of holes and electrons under the influence of changeable bias, this is used for control purposes, and the ability of an appropriately formed point contact collector electrode to release additional majority carriers which flow to the base when minority carriers arrive at the point contact, this is used for amplification purposes. This property of a point contact collector produces a current amplification and is known as the intrinsic alpha of a point contact collector.

Other features of the invention will be pointed out in the following description and claims and illustrated in the accompanying drawings which disclose, by way of example, the principle of the invention and the best mode which has been contemplated of applying that principle.

In the drawings:

FIG. 7 is a schematic diagram of this transistor connected for bistable performance.

FIG. 8 is the collector characteristic of this transistor connected as in FIG. 7.

FIG. 9 shows one embodiment of this transistor mounted for heat dissipation.

FIG. 10 shows another embodiment of this transistor mounted for heat dissipation.

Figure 1:
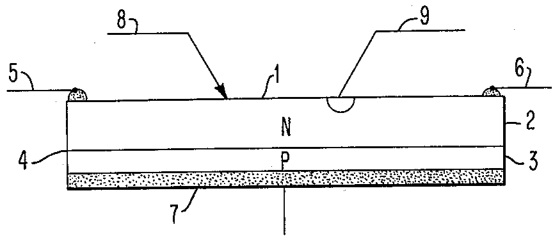
FIG. 1 is a schematic diagram of the transistor of this invention.

Referring now to FIG. 1, a transistor is shown comprising a body of semiconductor material 1, for example, germanium or silicon containing significant impurities. The body comprises two zones 2 and 3, respectively of N and P type conductivity, separated by the barrier 4. The opposite ends of the N type material are provided with ohmic connections 5 and 6 which, for example, may be soldered. An ohmic connection 7 is provided to the entire surface of the "P" type material 3. An emitter 8 is provided making point contact with the N type material 2 and a collector 9 is provided also making point contact with the N type material 2.

The transistor of FIG. 1 is made using techniques established as general practice in the art. For example, the semiconductor body 1 comprising the P and N type regions and the barrier 4 may be produced by growing a P-N junction and grinding to size, by diffusion of P type material onto the N type material or other techniques used to produce semiconductor bodies containing P-N junctions. Also the point contact collector 9 is usually made of material containing an N type of impurity, Phosphor bronze being an example, and is electroformed by condenser discharge or similar means.

The devices illustrated are relatively small which has necessitated some exaggerations in proportions in the interest of clarity, however, certain dimensions are critical in the various embodiments and applications described below and these dimensions will be pointed out where it is necessary that they be maintained.

In all applications and embodiments it is necessary that the thickness of the N type material 2 be near the diffusion length for the average lifetime of the excess carriers in the semiconductor, as a maximum, and it can be considerably thinner as occasion warrants. This diffusion length is a function of the carrier lifetime of the material used and is influenced by the magnitude of the collector bias. This thickness dimension may readily be established by one skilled in the art. Similarly, the thickness of the P type region 3 is of importance, however, here it is necessary only that this P type region 3 be sufficiently thin that with the contact 7 covering all of its surface the entire region is essentially unipotential. This dimension varies with the specific resistance of the material, and in many cases has been found to be in the vicinity of .0002 inch. The dimension from point contact emitter 8 to collector 9 should be maintained within the standard distance tolerances used in point contact transistor manufacturing practice which is generally in the vicinity of .001 to .005 inch.

The various embodiments of the transistor of this invention exhibit distinctive types of performance when connected for certain circuit applications. These types of performance will be described below together with a particular embodiment of the transistor and a circuit application selected to aid in the illustration of the transistor operation.

*Control of collector characteristics*

The transistor of this invention, as shown in FIG. 1, when connected with a potential across the N type region 2 will perform in such a manner that the variation in collector current with collector voltage for a given emitter input current may be controlled and arbitrarily selected by variation of this potential across the N type region 2. This variation of collector current with collector voltage for a given emitter input current is known in the art as the collector characteristic of the transistor.

Figure 2:
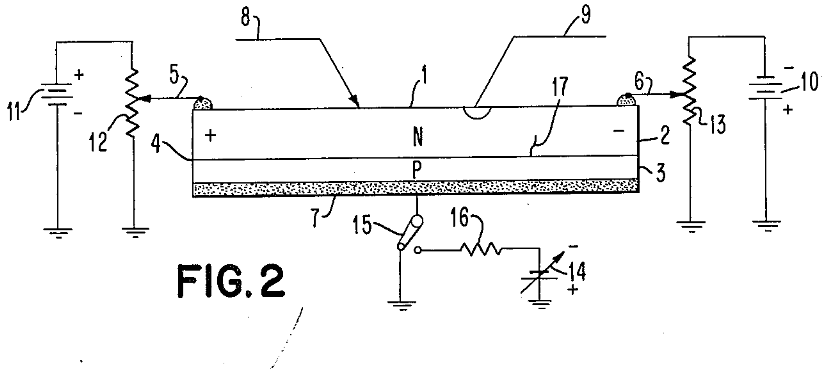
FIG. 2 is a schematic diagram of the transistor of this invention connected to produce controllable variable collector characteristics.

In order to produce the desired potential across the N type region 2, the circuit shown in FIG. 2 may be used, but this potential difference may be developed in many ways and the circuit of FIG. 2 is used for illustration only. Referring now to FIG. 2, the transistor of FIG. 1 is shown with the potential difference, across the N type region 2, being provided by D.C. potential sources 10 and 11 which apply through variable resistors 12 and 13, positive and negative potentials respectively to terminals 5 and 6. Terminal 7 is connected to ground. Variable D.C. potential source 14 may be connected to apply negative potential to terminal 7 through resistor 16 and switch 15 for control purposes to be later explained.

The potential difference between terminal 5 and terminal 6 produces a potential gradient in N region 2 from + at terminal 5 to − at terminal 6 as is labelled in FIG. 2. The P region 3 having an ohmic contact 7 covering its entire surface and having very little thickness is essentially of unipotential throughout. For purposes of illustration electrodes 8 and 9 are considered to have no potenital applied to them. The N type region 2 with its potential gradient and the unipotential P region 3 thus have a point of equipotential which is arbitrarily located and labelled point 17 in FIG. 2. Under these circumstances the voltage of P region 3, between this point 17 and terminal 6, is more positive than that of the N region 2 and hence the portion of the barrier 4, from point 17 to terminal 6, is biased in the forward conducting direction, whereas between point 17 and terminal 5, the N region 2 is more positive than the P region 3 so that this portion of the barrier 4 is biased in the reverse direction. The portion of the barrier 4 that is biased in the forward conducting direction is capable of injecting holes into the N type region 2, and the quantity of holes injected will have an effect on the collector current. The equipotential point 17 may be moved anywhere along barrier 4 by varying the potential applied across terminals 5 and 6. The location of point 17 affects the size of the forward biased portion of the barrier 4 and thus the quantity of injected holes, and the magnitude of the collector current. Thus the control of the position of point 17 results in an ability to control and select the collector characteristics of the transistor. Potentials applied to electrodes 8 and 9 will affect the location of point 17 but the principle of operation remains the same and adjustment of potentials on terminals 5 and 6 will overcome the effects of potentials applied to 8 and 9.

Figure 3:
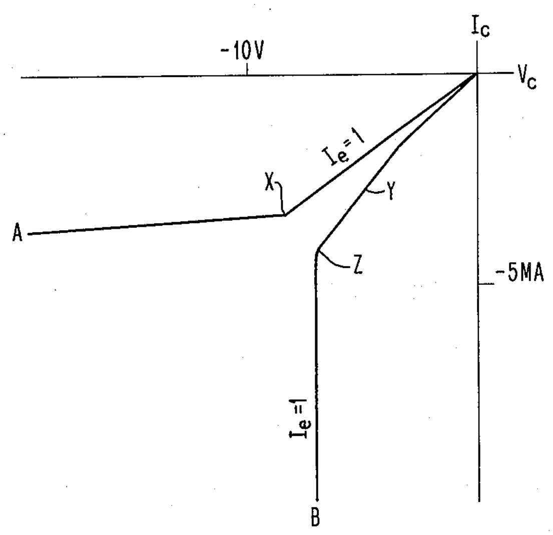
FIG. 3 shows examples of the variable collector characteristic curves of this transistor.

A graphical representation of this property may be observed by referring to FIG. 3 which shows the variation of collector current, labelled $I_c$, with collector voltage $V_c$ for a given emitter current $I_e$. FIG. 3 is a greatly simplified illustration of the collector characteristic of the novel transistor of this invention. The curves are approximate, based on a number of assumptions, and are intended only to present a clear picture of the relative changes in slope of the characteristic. In FIG. 3, curve A represents the normal collector characteristic for a point contact transistor wherein the collector current $I_c$ increases steadily with increases in collector voltage $V_c$ until a condition known as current saturation takes place. In a point contact transistor, the emitter provides the only source of injected holes and when all holes arrive at the collector from the emitter the transistor is said to be in a current saturated condition and in this condition a further increase in $V_c$ causes only a slight increase in $I_c$. The region where saturation begins is labelled X and the curve A beyond this point indicates no appreciable change in collector current $I_c$ with increases in collector voltage $V_c$. The transistor of this invention can be made to exhibit a collector characteristic such as in this curve A of FIG. 3 if (referring to FIG. 2), the following circuit adjustments are made. These adjustments are: terminal 6 is placed at ground potential through adjustment of variable resistor 13, terminal 5 is placed only very slightly + with respect to collector 7 by adjustment of variable resistor 12, and P region 3 is held slightly negative with respect to ground by connecting terminal 7, through switch 15 and resistor 16, to the negative terminal of D.C. potential source 14, which latter prevents P region 3 from contributing any holes to the collector 9. Under these conditions the P region 3 has no effect and the behavior of the transistor is as that of a normal point contact transistor.

A collector characteristic indicating a completely different type of transistor performance is shown by curve B of FIG. 3. This collector characteristic may be produced by making the following adjustments to the circuit of FIG. 2; connect terminal 6 directly to ground by adjusting variable resistor 13, and connect terminal 7 to a suitable very slightly negative potential through switch 15 and a constant negative current generator combination of resistor 16 and variable battery 14. Terminal 5 is now adjusted considerably positive. The effect of grounding terminal 6 is to move the equipotential point 17, toward terminal 5, which forward biases, a very large area of barrier 4, and in turn makes a larger source of holes available to the collector. The only effect of connecting terminal 7 to a constant negative current generator is to provide a current drain to prevent the forward biased portion of the barrier 4 from injecting holes at zero collector voltage so that curve B passes through the intersection of $I_c$ and $V_c$ as shown. This neutralizes a self-biasing effect to be later explained. Under these conditions, following curve B of FIG. 3, at first the collector current $I_c$ increases steadily with increases in collector voltage $V_c$, as in curve A, since for small collector voltages holes do not arrive at the collector from the P region in any appreciable quantity. However, as the collector current increases with increasing collector voltage, the associated internal electric field in the crystal has an increasingly greater effect on the velocity of the holes injected by the P region and causes more of them to arrive at the collector. The arrival of these holes produces a large increase in collector current due to the amplification or intrinsic alpha of the collector. This is in effect an internal positive feedback condition. A manifestion of this condition is the change in slope of the region Y of the curve B. Through variation of the potentials, applied to the N and P regions 2 and 3, the length of region Y may be selected. For a given set of potentials applied to the N and P regions 2 and 3, there will exist a critical collector voltage at which the internal feedback mechanism causes the transistor to have nearly vertical characteristics. This critical voltage point is labelled as point Z on curve B of FIG. 3. Considering that the amplification factor, alpha, of a transistor is defined in the art, as the ratio of the increase in collector current to the increase in emitter current and that, after point Z is passed on curve B, great changes in $I_c$ occur with zero change in $I_e$, then, under these conditions, the alpha of this transistor approaches infinity.

From the above description it may be seen that complete control of the collector characteristics may be had through the use of the transistor of this invention, while because of the path from the emitter 8 through the thin N region 2 to ground a relatively constant low input impedance is maintained. The curves shown were selected for illustration only to explain the operation and should not be construed as limitations of the types of characteristics that may be obtained. The dimensions of one transistor that operated successfully are the following. Referring to FIG. 1, the semiconductor body 1 is square being .080 inch on each side, the overall thickness is very near .001 inch having the N region 2 of approximately .0009 inch in thickness and the P region 3 being approximately .0001 inch in thickness. The collector 9 is located in the center of the semiconductor body 1 and the spacing from emitter 8 to collector 9 is .001 to .002 inch. These dimensions may be varied over a wide range by one skilled in the art and are here included to aid in understanding and to facilitate practicing the invention only and should not be construed as limitations.

*Self biasing performance*

Figure 4:
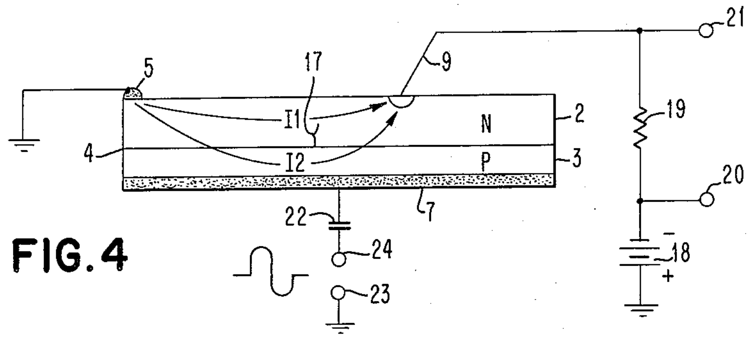
FIG. 4 is a schematic diagram of this transistor connected to show the self biasing performance.

The transistor of this invention can be made to operate in such a manner that the need for a source of emitter biasing potential is eliminated under certain circumstances and considerably reduced in others. This type of performance is accomplished by using the potential developed within the transistor structure itself as a source of emitter bias potential. Accordingly, to produce this type of operation, the unipotential P type region serves as the emitter, one of the ohmic connections to the N type region is used as the base connection and the formed collector is the collector connection. Referring now to FIG. 1 in this application, terminal 7 is the emitter connection, either terminal 5 or terminal 6 is the base connection and terminal 9 is the collector connection. In this embodiment the unused base terminal and the point contact emitter 8 may be eliminated or merely left with no connection. A simplified schematic diagram of the transistor in a circuit illustrating the self biasing performance is shown in FIG. 4 wherein identical elements bear the same reference numbers as FIG. 1. For simplicity the terminals having no connection thereto have been eliminated. Referring now to FIG. 4, negative bias is provided on collector 9 by battery 18 through an output signal developing means, arbitrarily selected and shown as resistor 19. Output terminals 20 and 21 are provided for various control purposes known in the art. Input signals are applied to the emitter 7 through decoupling capacitor 22 by impressing the signals on input terminals 23 and 24.

Under the conditions as shown in FIG. 4 two current paths are available to the base current flowing from terminal 5 to collector 9. One of these paths labelled $I_1$ is directly from terminal 5 to collector 9 through the N region 2 which presents a given impedance to current flowing in this path because of the resistance of the semiconductor material, hence a definite potential gradient is set up in the N region 2 between terminal 5 and collector 9. The second current path labelled $I_2$ is from terminal 5 through the N region 2 and barrier 4 to the unipotential P region 3 hence through barrier 4 and N region 2 to collector 9. The impedance of the second current path is selected at a lower value than that of the first current path. Because of the variation in impedance in current paths $I_1$ and $I_2$ the point of equipotential 17 will lie at a definite point between terminal 5 and collector 9, hence the portion of the barrier 4 between point 17 and collector 9 is forward biased while the remaining portion of barrier 4 between point 17 and terminal 5 is reverse biased. The current flowing in the path $I_2$ entering the P region 3 through the reverse biased portion of the P–N junction 4 will be limited to the reverse saturation current that is characteristic of the junction, this is normally quite small, however, when this current leaves the P region 3 in the forward biased portion of the barrier 4, the P region 3 at that point is acting as an emitter and injecting holes in the N region 2. It is these holes, which upon their arrival at the collector 9, increases the collector current due to the intrinsic alpha or current multiplying factor of the point contact collector and give rise to the self biasing performance of the transistor.

Figures 5, 6:
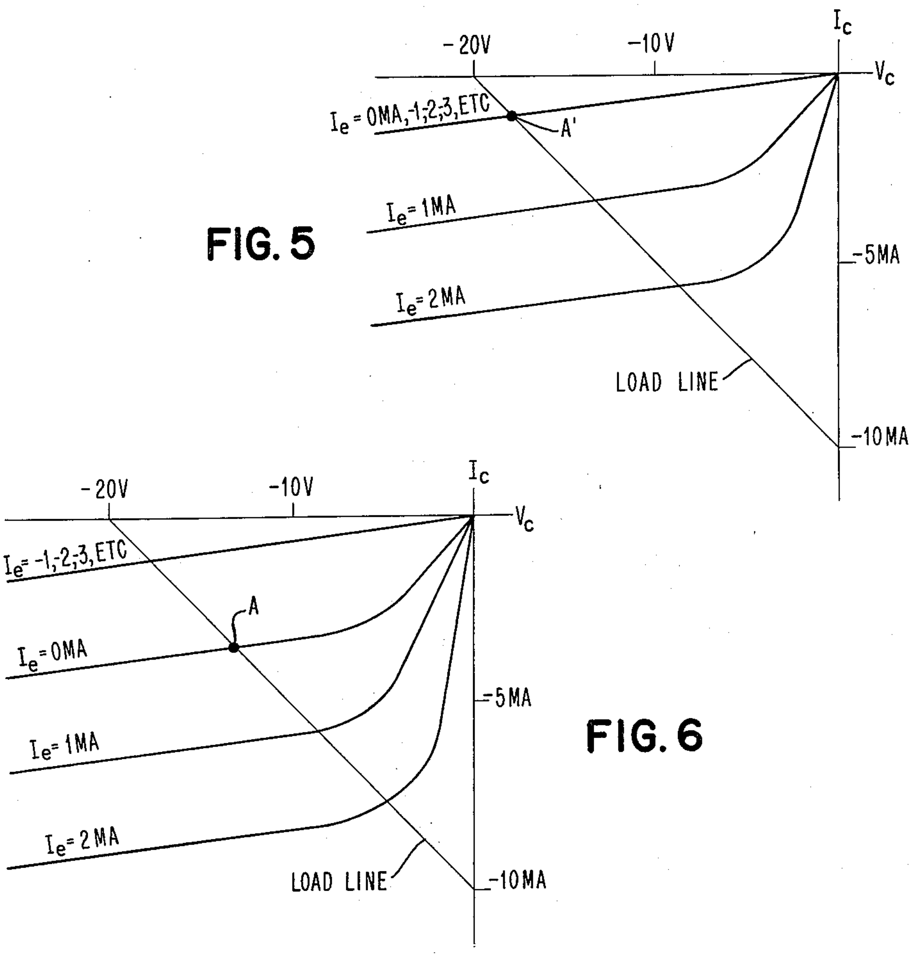
FIG. 5 is the collector characteristic of a normal transistor connected as in FIG. 4.
FIG. 6 is the collector characteristic of this transistor connected as in FIG. 4.

The effect of this self biasing performance is illustrated graphically by the families of collector characteristic curves in FIGS. 5 and 6 which show the variation of collector current with collector voltage for several values of constant emitter current.

These curves are generated by applying selected values of emitter current to terminal 7 through a D.C. constant current source not shown. This discussion covers the operation for case of $I_e=0$ and while the addition of current at terminal 7 has an effect on the amount of current in path $I_2$ the basic principle described above does not change.

The family of curves in FIG. 5 show the collector characteristics for a conventional point contact or junction transistor connected in the circuit of FIG. 4 whereas the family of curves in FIG. 6 show the collector characteristics for the transistor of this invention connected in the circuit of FIG. 4. By comparing the family of curves in FIG. 5 with those in FIG. 6 it may be seen that the effect of the self biasing is to shift the constant emitter current parameter lines in the direction of increased collector current so that the parameter line $I_e=0$ for this transistor in FIG. 6 follows closely the parameter line $I_e=1$MA for the conventional transistor in FIG. 5. In FIGS. 5 and 6, load lines are provided, the slopes of which are determined by the magnitude of the output impedance and these slopes are the same in both figures. The points A and $A^1$ represent the operating points for both transistors for zero emitter current. The operating point A in FIG. 6 for this transistor at zero emitter current is already in the active or linear amplification region of the transistor whereas to obtain a corresponding point in FIG. 5 for the conventional transistor the operating point $A^1$ must move in the increased collector current direction which requires the use of an external emitter biasing supply. Thus for small signal operation the transistor of this invention having a signal impressed at terminals 22 and 23 in FIG. 4 is capable of linear and active amplification in both directions along the load line from point A in FIG. 6 without an emitter bias supply whereas it would be necessary to apply an emitter bias source to a conventional transistor to move point $A^1$ into the active and linear region. In cases involving large signals where it is necessary to supply an emitter bias source to bring point A sufficiently far into the active region to correctly reproduce the impressed signal, the magnitude of the emitter bias source is smaller for this transistor than it is for the conventional transistor because point A is already partially in the active region and need not be moved as far as $A^1$.

The basic principle of the self biasing performance, which is the provision of two current paths, one of which includes a hole injecting emitter which is at a point of potential between the collector and the base may be applied in many ways in addition to the structure shown in FIGURES 1 and 4. For one example, the P region 3 being unipotential may be made up of 2 small regions connected together, one of these being located near the base, the other near the collector. Continuing further, other rectifying elements may be used for the portion of the auxiliary current path $I_2$ near the base connection such as a junction diode not part of the semiconductor block 1, connected to terminal 5 or a formed point contact made to the semiconductor block 1 near terminal 5, similarly any hole injecting source may serve as the forward biased portion of the auxiliary current path $I_2$, for example, a point contact emitter as well as a junction. In all embodiments, the self biasing performance takes place when two paths for the base to collector current as shown in FIGURE 4 are provided and the second path labelled $I_2$ has an overall impedance which is less than the impedance of the first path which goes directly from base to collector.

To maintain the relationship of the impedances of the two paths, it is necessary to know the resistances of the N and P material, the back resistance of the portion of the auxiliary current path near the base connection and the forward resistance of the hole injecting portion of the auxiliary current path. Having this knowledge one skilled in the art can readily adjust the dimension between terminal 5 and collector 9 to establish this requirement. A successfully operated transistor having the self biasing performance had the same dimensions as the dimensions given for the controlled collector characteristics. The dimension from treminal 5 to collector 9 is in the vicinity of .025 inch.

*Bistable performance*

The transistor of this invention, when connected so that the P-N junction serves as an emitter and a sufficiently positive potential is applied to the "N" type region, will have two stable states of operation with control such that a very small input signal applied to the base can convert the transistor from a state of low collector current to a state of extremely high collector current. In performance, this bistable behavior is very similar to thyratron action. An illustration of the transistor of FIGURE 1 connected in a circuit to show bistable operation is shown in FIGURE 7. This circuit was selected for simplicity and terminals that are not used in this instance are not shown. Referring now to FIGURE 7 in addition to items previously described, provision is made to apply positive potential to N region 2 by battery 25 and resistor 26, and terminals 27 and 28 are provided to permit negative signals to be applied between N region 2 and ground.

Under the circuit conditions as shown in FIGURE 7, the N region 2 is held more positive than the P region 3 through the positive potential applied to terminal 5 by battery 25 and the fact that the unipotential P region 3 is connected to ground through terminal 7. Hence, the barrier 4 is reverse biased and does not contribute any hole current and the only current flowing in the collector circuit is supplied by the base. A negative signal applied at terminal 5 changes the potential relationship across the barrier 4, by pulling the N region 2 negative with respect to P region 3 and permits holes to be injected which can arrive at the collector from the junction emitter. These holes, arriving at the collector 9 initiate an internal positive feedback condition due to the intrinsic alpha of the collector and permit a large flow of collector current.

This situation is represented graphically in FIGURE 8 which shows the variation of collector current labelled $I_c$ with collector voltage labelled $V_c$ for values of base current labelled $I_b$. The $I_b$ values are a function of the potential applied to the N region 2. A load line is shown, the slope of which is determined by the output impedance in the collector circuit.

Referring now to FIGURE 8 the family of collector characteristic curves are shown for the transistor connected as shown in FIGURE 7. In each curve there is little increase in collector current $I_c$ with increases in collector voltage $V_c$ until the reverse bias of the barrier 4 is overcome. When this bias is overcome the P region 3 injects holes and the internal positive feedback produced by the intrinsic alpha of the collector results in a heavy flow of collector current. Hence, this positive internal feedback produces a negative resistance portion of the collector characteristic which permits bistable action.

The reverse bias on the barrier 4 may be overcome by increasing the negative collector bias potential or by applying a negative signal to the N region 2 to directly change the potential relationship between the N region 2 and the P region 3. The effect of increasing the negative collector bias potential is to move the operating point along until the knee of the curve is reached at which point holes are injected by the P region 3 and the internal positive feedback rapidly increases the collector current. This is shown by the negative resistance portion of the curve beyond the knee and a stable operating point is reached at point B where the collector current $I_c$ is limited by the impedance of the collector circuit. The effect of the application of a negative signal to the N region 2 is to reduce the base current $I_b$. Since the knee of the curve is determined by the base current $I_b$ then a sufficient reduction of the base current effectively moves the operating point beyond the knee of the curve and initiates the internal positive feedback action and the circuit moves to the high collector current stable operating point B.

Referring now to FIG. 8 it is evident from the curves that the magnitude of the triggering signal may be made small or large to suit operational sensitivity requirements by proper selection of the operating point for the particular circuit application.

In order to return the transistor to the initial or low collector current stable state, it is necessary to reduce the injection of holes momentarily to the point where the positive feedback due to the intrinsic alpha of the point contact collector is interrupted and the reverse bias on the barrier 4 is again established. The reduction of the hole injection may best be accomplished by reducing the collector potential.

The bistable performance of this transistor may be compared with the action of a thyratron in that this device is held in a low conduction state by a bias which may be overcome by a small control signal analogous to the signal applied to the control grid of a thyratron and, once converted to the high current state, this device can be reconverted to the low current state only by reducing the collector potential below the value necessary to overcome the bias. This is comparable to reducing the plate potential of a thyratron to a point so low that ionization of the gas cannot be maintained.

For bistable operation such as in thyratron related applications the transistor of this invention exhibits the following additional characteristics of performance. One of which is a construction such that the heat which is produced by the heavy currents in this application is more easily dissipated. The heat may be carried away by mounting the semiconductor body on a large volume and good heat conducting element such as a rod or plate. An example of this type of mounting is shown in FIGURE 9 for the transistor of FIG. 1 wherein the unipotential contact 7 to the P region 3 is a heat conducting plate. Another characteristic of performance is that this transistor can present very low input and output impedances on the order of a few ohms. This may be seen from the fact that the input impedance is the resistance of the very thin semi-conductor material. Similarly, as is evident from the curves in FIG. 8, the value of output current to output voltage indicates a very low output impedance. Units have been made with an output impedance as low as 2 ohms with 1 ampere flowing in the collector circuit. Still another characteristic of performance is that the operating range of this transistor includes higher voltages than other known high power semiconductor devices. The double base diode is an example of a high power semiconductor device. Referring to the curves of FIG. 8, it may be seen that with increased $I_b$ the operating voltage range increases sharply. Devices have been built operating with as high as 100 v. in the collector circuit. A related characteristic of performance is that this transistor, when connected for bistable performance, may be triggered from the low collector current stable state to the high collector current stable state by a light source, the rays of which do not strike in the immediate vicinity of the collector but merely strike the semiconductor body at any point. While the transistor of this invention is very sensitive to the effects of heat and light and these effects will be explained in detail later this particular effect of light on the circuit of FIG. 7 operates in a manner different from that normally seen in the art and is especially useful in connection with this bistable performance. The effect of light on the transistor as shown in FIG. 7 is such that the light produces holes in the N region 2 in such quantity that some of the reverse bias on barrier 4 caused by the positive potential on N region 2 and ground potential on P region 3 is removed and permits holes to be injected by the P region 3 which flow to the collector 9. This effect takes place even through the light strikes the N region 2 at a point distant from the collector beyond the diffusion distance of the carriers and the injected carriers die out before they can reach the collector 9. The effect of the lowering of the reverse bias by the light may be observed from the fact that the light in producing hole-electron pairs disturbs the thermodynamic equilibrium of the semiconductor crystal because the holes diffuse freely to the P region 3 whereas the electrons must take the higher impedance path from terminal 5 through resistance 26 and battery 25.

Many variations in electrode positioning the structure are possible in this embodiment, for example, the terminal 5 may be a ring ohmically connected to the N region, having the collector at its center and similarly, several concentric rings may be used to control the magnitude and sources of the control signal to be applied. An example of this construction is shown in FIG. 10 wherein two concentric ohmic base terminals are shown with the crystal mounted on a heat conducting rod.

A successfully operated transistor in this embodiment had the following dimensions. The semiconductor body 1 is square, approximately .050 inch on a side. The overall thickness is approximately .001 inch having an N region 2 of about .009 inch and a P region 3 of about .0001 inch. The collector 9 is located in the center of the semiconductor body 1. For high frequency operation the distance from base to collector becomes important. This distance is the dimension from terminal 5 to collector 9 and varies approximately in the range from .020 to .001 inch. This distance is one of the factors responsible for a delay from the time a signal is impressed on N region 2 at terminal 5 until an effect is produced on the barrier 4. The other factor being the voltage across the barrier. Proper adjustment of these two factors may readily be made by one skilled in the art for optimum operation at a selected frequency.

*Effects of heat and light*

The transistor of this invention is extraordinarily sensitive to the effects of heat and light when connected with a portion of the junction barrier biased in the reverse direction. Under this condition holes are generated in the N type material by the presence of the heat or light and the effect of these holes is to lower the back resistance of the reverse biased portion of the barrier, the P type region then injects more holes to the collector, the effect of these is amplified by the intrinsic alpha of the formed point contact collector and results in an increased collector current. While the individual processes by which heat and light generate holes in semiconductor material are not the same, although they are well known in the art, the effect of the presenece of an increased quantity of holes in the N type material of the transistor, namely, the lowering of the back resistance of the reverse biased portion of the barrier, is the same whether the increased holes are caused by heat or light.

Figure 11:
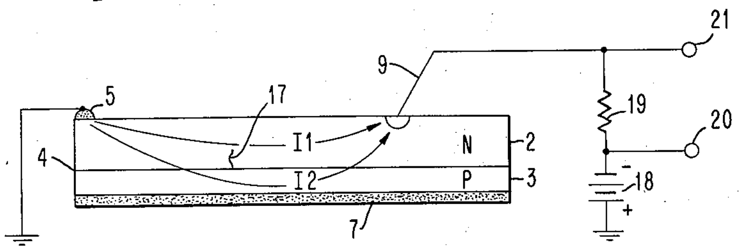
FIG. 11 is a schematic diagram of this transistor connected to show the effects of heat and light.

In FIGURE 11 is shown an illustrative embodiment of this transistor connected to indicate the effects of the presence of light falling on its surface or of a change in temperature. In FIGURE 11 the transistor is so connected as to provide two paths for current from the base at terminal 5 to the collector 9, these are labelled $I_1$ and $I_2$ with a point of equipotential 17 dividing forward and reverse biased portions of barrier 4 as previously described in connection with FIGURE 4 and the self biasing performance. When light is directed on the surface of the N region 2 or when an increase in temperature occurs the presence of holes in the N region 2 unbalances the thermodynamic equilibrium, decreases the back resistance of the reverse biased portion of the barrier 4 between terminal 5 and equipotential point 17 and permits an increase in current in the $I_2$ path. The increase in current in path $I_2$ is in turn amplified by the intrinsic alpha of the collector resulting in large changes in collector current. In most conventional photo and thermo-sensitive devices the sensitivity of a junction to heat and light, or the effect of heat or light produced holes, being amplified by a point contact collector, are used, however, in each case the only holes having an effect on the collector current are those within the diffusion length for the average lifetime of the excess carriers in the semiconductor of the particular barrier or collector they are to reach. Holes not within this distance die out and have no effect. In this transistor the structural relationships are such that greater quantities of holes produced in the N region 2 are capable of affecting the collector current by being amplified by the intrinsic alpha of the collector. The holes that can reach the collector in their lifetime affect the collector current directly, however, this is usually very small, at the same time all holes in the N region 2 in the reverse biased portion can reach the barrier in their lifetime because of the thickness of N region 2 and all contribute to reducing the back resistance of barrier 4 and increasing the current in the $I_2$ path. Both the holes reaching the collector directly and those injected by the forward biased portion of the barrier 4 as a result of an increase in $I_2$ have their effect on the collector current amplified by the intrinsic alpha of the collector. Hence, the sensitivity of this transistor to heat and light is roughly approximate to the sensitivity of the reverse biased portion of the barrier 4 itself multiplied by the intrinsic alpha of the collector and the amplified effect of the holes reaching the collector directly.

Figure 12:
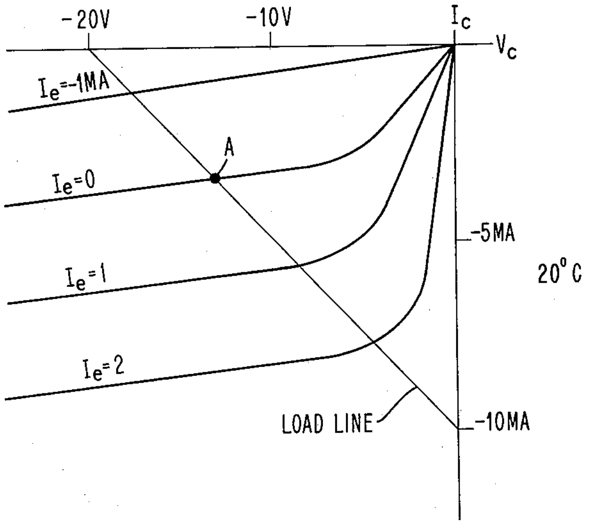
FIG. 12 is the collector characteristic at 20° C. of the transistor in the embodiment of FIG. 10.
Figure 13:
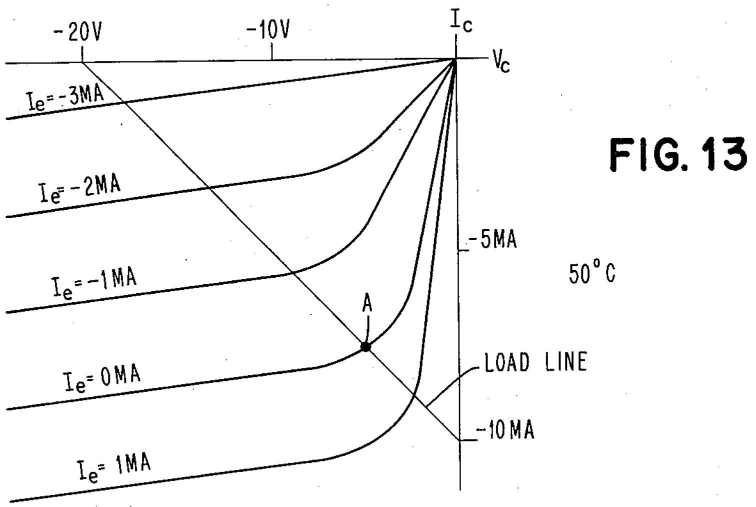
FIG. 13 is the collector characteristic of the transistor of FIG. 10 at 50° C.

To illustrate the effect of the additional holes in the N region 2 as produced by heat or light the collector characteristic curves for the transistor connected as in FIGURE 11 are shown in FIGURE 12 for a temperature of 20° C. and in FIGURE 13 for a temperature of 50° C. The load lines shown have the same slopes which are determined by the impedance of the collector circuit. Comparing FIGURE 11 with FIGURE 12, the result of the presence of increased holes in the N region 2 is to move the operating point A for 0 emitter current further into the active or linear amplification region of the transistor while at the same time the slope of the curves and their spatial relationship remains essentially the same, hence, the small signal alpha of the transistor remains unchanged. This may be seen from the fact that the operating point A moves from one value of collector current in FIGURE 11 to an increased value of collector current in FIGURE 12 as a result of the presence of the holes in the N region 2 produced by the 30° change in temperature.

It is evident that the principle of this sensitivity to heat and light, namely that the increase in holes reduces the reverse bias on the barrier and increases the current in the second path to the collector where the increase is amplified by the intrinsic alpha of the collector, will operate where there is any source of holes to the N type region so long as the holes can reach the barrier in their lifetime.

Any hole emitting source such as an electron beam or electrode will provide the reduction in reverse bias in accordance with this principle so long as its location with respect to the collector is greater than the diffusion length for the average lifetime of the excess carriers and it is within the reverse biased portion of the junction barrier. When such a source has been used the current from this electrode and the current from a signal applied to the unipotential P region directly, add linearly for forward positive inputs and the collector current increase is proportional to their sum.

Successfully operated devices exhibiting this principle of sensitivity have had the same dimensions as the devices used for controllable collector characteristics.

*Pulse delay performance*

The transistor of this invention when connected with the P type region as the emitter exhibits delay characteristics during pulse operation. Under conditions where an input signal is impressed through the P type region acting as an emitter, so that the emitter is driven from zero bias to a negative value beyond cut off and then back to zero bias; the output pulse at the collector is delayed in returning to zero after the input pulse returns to zero by a period of time that is approximately proportional to the amount beyond cut off that the emitter was driven within the normal operating range for point contact transistors used in the art.

Figure 14:
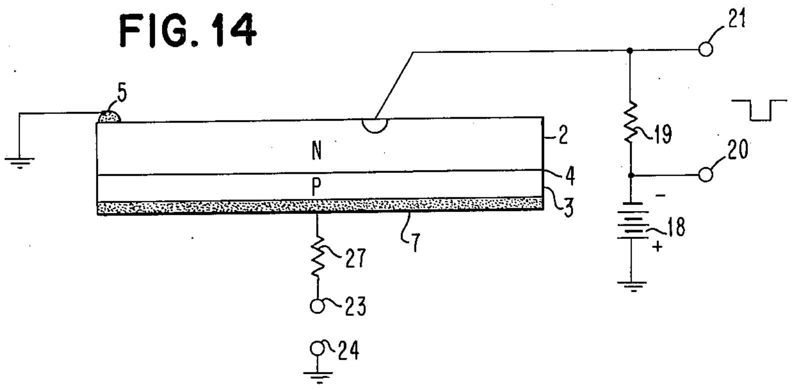
FIG. 14 is a schematic diagram of this transistor connected to show pulse delay performance.
Figure 15:
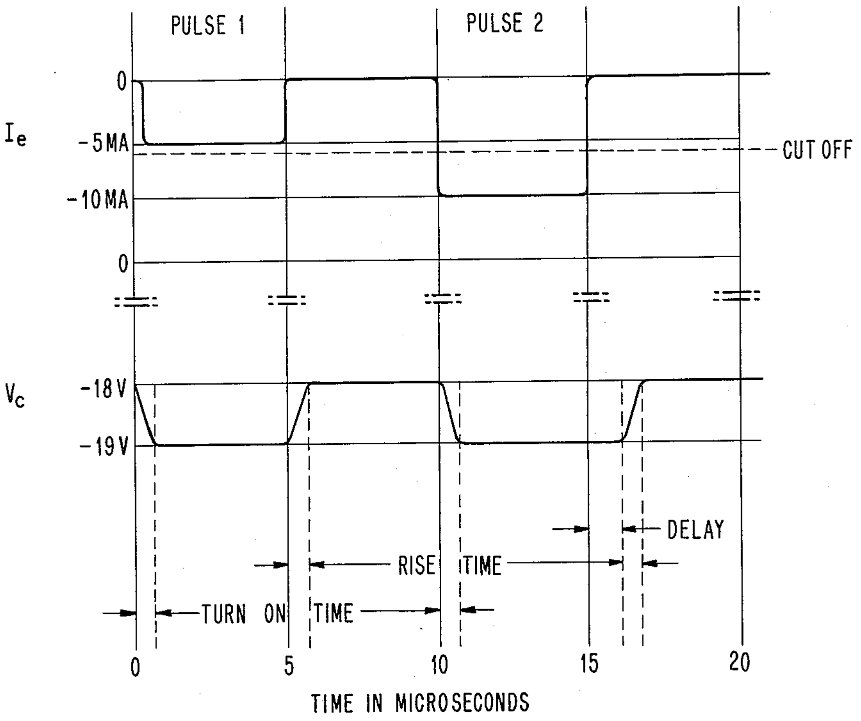
FIG. 15 is a graph of input current and voltage and output voltage with time for the transistor connected as in FIG. 14.

To illustrate this type of performance, the transistor of FIGURE 1 is shown in FIGURE 14 connected for pulse type operation, wherein the base terminal 5 is connected to ground, negative input signals are impressed across the input terminals 23 and 24, these signals pass through the input impedance 27 and produce changes in output level across load impedance 19 which changes in level are available at terminals 20 and 21. The circuit of FIGURE 14 when a series of negative input pulses are applied at terminals 23 and 24 produces a series of longer negative output pulses at teminals 20 and 21. Referring to FIGURE 15 there is shown a simplified plot of the emitter current $I_e$, and the collector voltage $V_c$ with respect to time. The first negative pulse impressed as shown by curve $I_e$ does not drive the transistor to cut off hence the output pulse as shown on curve $V_c$ in the time from 0 to 5 microseconds labeled Pulse 1 begins to recover at the same time that the input pulse recovers, and does so in a short time interval comparable to that of the turn on time. The second pulse impressed drives the transistor beyond cut off, as may be seen from the fact that the $I_e$ goes negative beyond cut off. The $V_c$ output curve for this pulse shows a delay in recovering after the input pulse returns to zero. This delay is shown on the $V_c$ curve at the end of the pulse from 10 to 15 microseconds labeled Pulse 2.

The reason for this delay period is that the emitter voltage in going farther negative after cut off charges the depletion region of the P-N junction and when the emitter signal switches back to zero external current the emitter voltage cannot rise immediately until the charged depletion region is discharged. The time required for this discharge is the time delay in the recovery of the output pulse and hence the greater this charge, or the farther beyond cut off the emitter is driven, the longer the time delay. The depletion layer has the effect of a capacitor and is usually represented as such in equivalent circuits. A discussion of the charge on the depletion region is made in an article entitled "Theory of PN Junctions in Semiconductors" by W. Shockley—Bell System Technical Journal, vol. 28, p. 435, 1949.

A successfully operated device that exhibited this delay had the same dimensions as the transistor used to demonstrate the controllable collector characteristics and produced delays of from 1 to 3 microseconds.

While there have been shown, described and pointed out the fundamental novel features of this invention as applied to certain embodiments, it will be understood that many omissions and substitutions in form and details may be made by one skilled in the art. For example, in all embodiments the regions of N and P type materials may be used in opposite positions by making minor polarity changes such as may readily be done by one skilled in the art. The embodiments shown and ranges of operation described are selected only to present a clear picture and should not be construed as limitations. It is the intention, therefore, to be limited only as to the scope of the following claims.

What is claimed is:

1. A semiconductor circuit element for controlling the flow of electric current comprising a first zone of one conductivity type having associated means applying an essentially uniform potential throughout said first zone, a second zone of opposite conductivity having a thickness near the diffusion distance for the average lifetime of the semiconductor carriers, a barrier separating said first and said second zones, means including at least one ohmic electrode applying a potential gradient from positive to negative with respect to said uniform potential first zone in said second zone parallel to said barrier, an electroformed point contact collector electrode making current amplifying contact with said second zone and signal emitting means including a minority carrier injecting source associated with said second zone and located sufficiently close to said collector to permit transistor action.

2. A semiconductor circuit element for controlling the flow of electric current comprising a semiconductive body including a first zone of one conductivity type, means applying an essentially uniform potential throughout said first zone, a second zone of opposite conductivity type having a thickness near the diffusion distance for the average lifetime of the semiconductor carriers, a barrier separating said first and said second zones, an electroformed point contact collector making current amplifying contact with said second zone, signal emitting means including a minority carrier injecting source associated wtht said second zone and located sufficiently close to said collector to permit transistor action, means including at least one ohmic electrode to apply potentials to said second zone to establish a potential gradient therein parallel to said barrier such that portions of said barrier are positively and negatively biased with respect to said unipotential first zone said means including further means for varying said gradient thereby changing the extent of said positive and negatively biased portions of said barrier to control the amplification of said semiconductor circuit element.

3. A semiconductor circuit element for controlling the flow of electric current comprising a semiconductor body including a first zone of one type conductivity and a second zone of opposite type conductivity separated by a barrier, said first zone having associated means for maintaining an essentially uniform potential throughout said first zone, said second zone having a dimension from said barrier to the surface parallel to said barrier near the diffusion distance for the average lifetime of semiconductor carriers in said semiconductor body, an electroformed point contact current amplifying collector located on the surface of said second zone parallel to said barrier, a signal emitting source having means of injecting minority carriers in said second zone located sufficiently close to said collector to permit transitor action means including at least one ohmic electrode to establish a potential gradient in said second zone parallel to said barrier so that portions of said barrier are positively and negatively biased with respect to said unipotential first zone said means including further means for varying said gradient thereby changing the extent of said positively and negatively biased portions of said barrier.

4. A thermo and photosensitive semiconductor circuit element comprising a semiconductive body including a first zone of one conductivity type, means applying an essentially uniform potential throughout said first zone, a second zone of opposite conductivity type having a thickness near the diffusion distance for the average lifetime of the semiconductor carriers, a barrier separating said first and said second zones, an electroformed point contact collector making current amplifying contact with said second zone on the surface parallel to said barrier, an ohmic base connection to an extremity of said second zone remote from said collector and means establishing a potential gradient in said second zone parallel to said barrier such that portions of said barrier are positively and negatively biased with respect to said unipotential first zone.

References Cited in the file of this patent

UNITED STATES PATENTS

| | | |
|---|---|---|
| 2,604,496 | Hunter | July 22, 1952 |
| 2,666,814 | Shockley | Jan. 19, 1954 |
| 2,740,076 | Matthews et al. | Mar. 27, 1956 |
| 2,795,744 | Kircher | June 11, 1957 |
| 2,846,592 | Rutz | Aug. 5, 1958 |

FOREIGN PATENTS

| | | |
|---|---|---|
| 541,575 | Belgium | Mar. 26, 1956 |